United States Patent
Tsai

(10) Patent No.: US 10,184,977 B2
(45) Date of Patent: Jan. 22, 2019

(54) DEVICES AND METHODS FOR TESTING INTEGRATED CIRCUITS

(71) Applicant: Intel Corporation, Santa Clara, CA (US)

(72) Inventor: Han-Yao Tsai, New Taipei (TW)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 14/847,236

(22) Filed: Sep. 8, 2015

(65) Prior Publication Data
US 2017/0003342 A1    Jan. 5, 2017

(30) Foreign Application Priority Data

Jul. 2, 2015 (CN) .......................... 2015 1 0382967

(51) Int. Cl.
*G01R 31/28* (2006.01)
*G01R 1/04* (2006.01)

(52) U.S. Cl.
CPC ....... *G01R 31/2887* (2013.01); *G01R 1/0433* (2013.01); *G01R 31/2879* (2013.01); *G01R 31/2884* (2013.01); *G01R 31/2886* (2013.01)

(58) Field of Classification Search
CPC .............. G01R 19/257; G01R 31/2884; G01R 31/3004; G01R 31/3181; G01R 31/31813; G01R 31/26; G01R 31/2642; G01R 31/2648; G01R 31/2831; G01R 31/31702; G01R 33/0047; G01R 1/0491; G01R 31/265; G01R 31/3012; G01R 31/318511; H01L 2933/0033; H01L 33/48; H01L 2224/50; H01L 2225/06579; H01L 24/50

USPC ........ 324/750.3, 762.01–762.04; 702/57–59, 702/117–120; 439/482
See application file for complete search history.

(56) References Cited

U.S. PATENT DOCUMENTS

| | | | | |
|---|---|---|---|---|
| 3,676,777 | A * | 7/1972 | Charters | G01R 31/31905 324/754.07 |
| 3,818,237 | A * | 6/1974 | Straus | H04B 1/74 307/18 |
| 4,356,402 | A * | 10/1982 | Morimoto | H02J 9/08 307/19 |
| 5,412,337 | A * | 5/1995 | Kumakura | G01R 31/04 327/427 |
| 6,262,581 | B1 | 7/2001 | Han | |

(Continued)

FOREIGN PATENT DOCUMENTS

KR    1995-0003751    5/1995

OTHER PUBLICATIONS

Tekpower TP3005D-3 Bench Supply Review, http://www.loneoceans.com/labs/tekpower/, Nov. 2014.*

(Continued)

*Primary Examiner* — Patrick Assouad
*Assistant Examiner* — Demetrius R Pretlow
(74) *Attorney, Agent, or Firm* — Schiff Hardin LLP

(57) ABSTRACT

An integrated circuit includes a first power unit, a second power unit, and a selection switch. The first power unit generates a first output voltage and is coupled to a first load pin. The first load pin is coupled to a first load. The second power unit generates a second output voltage and is coupled to a second load pin. The second load pin is coupled to a second load. The selection switch outputs either the first output voltage or the second output voltage to a voltage pin according to a selection signal.

15 Claims, 4 Drawing Sheets

(56) References Cited

U.S. PATENT DOCUMENTS

| | | | |
|---|---|---|---|
| 7,969,181 B1* | 6/2011 | Fefer | H03K 19/017545 326/30 |
| 8,138,625 B2* | 3/2012 | Duan | G06F 11/2015 307/11 |
| 2002/0080663 A1* | 6/2002 | Kameyama | H03K 19/0016 365/200 |
| 2004/0145931 A1* | 7/2004 | Lin | G11C 16/30 363/147 |
| 2004/0148121 A1* | 7/2004 | de Obaldia | H03K 5/08 702/117 |
| 2004/0222810 A1 | 11/2004 | Frankowsky et al. | |
| 2006/0109034 A1* | 5/2006 | Okitsu | H03K 17/687 327/108 |
| 2007/0013359 A1 | 1/2007 | Hatagami | |
| 2007/0022334 A1* | 1/2007 | Kim | G11C 29/56 714/718 |
| 2007/0024306 A1* | 2/2007 | Jeddeloh | G01R 31/31905 324/756.07 |
| 2007/0205821 A1* | 9/2007 | Jungert | H03K 17/005 327/407 |
| 2008/0136427 A1 | 6/2008 | Cases et al. | |
| 2008/0246341 A1* | 10/2008 | Pelley | H02J 1/10 307/80 |
| 2011/0001509 A1* | 1/2011 | Kidokoro | G09G 3/006 324/762.01 |
| 2012/0062261 A1* | 3/2012 | Nelson | G01R 1/06738 324/755.09 |
| 2016/0057875 A1* | 2/2016 | Cordes | H05K 5/0091 324/757.05 |

OTHER PUBLICATIONS

Extended European Search Report dated Nov. 9, 2016 for European Patent No. 16174274.7.

Office Action dated Jun. 15, 2017 for Korean Pante Application No. 2016-0067965 (with English translation).

* cited by examiner

DEVICES AND METHODS FOR TESTING INTEGRATED CIRCUITS

CROSS REFERENCE TO RELATED APPLICATIONS

This Application claims priority of China Patent Application No. 201510382967.5, filed on Jul. 2, 2015, the entirety of which is incorporated by reference herein.

BACKGROUND OF THE INVENTION

Field of the Invention

The disclosure relates generally to methods and devices for testing integrated circuits, and more particularly it relates to methods and devices for testing integrated circuits by applying testing conditions and measuring testing items by using different pins.

Description of the Related Art

When an integrated circuit is in the final test (FT) process, the packaged integrated circuit is usually placed in the integrated-circuit socket to test whether the functions of the packaged integrated circuit are normal or not. When a power integrated circuit is in the final test process, it is usually required that a load current is drawn from the power integrated circuit and then that a check is made as to whether its output voltage meets specifications. Therefore, we need efficient devices and methods for testing integrated circuits.

BRIEF SUMMARY OF THE INVENTION

For solving the above problems, the invention provides methods and devices for testing integrated circuits by applying testing conditions and measuring testing items by using different pins.

In an embodiment, an integrated circuit comprises a first power unit, a second power unit, and a selection switch. The first power unit generates a first output voltage and is coupled to a first load pin, wherein the first load pin is coupled to a first load. The second power unit generates a second output voltage and is coupled to a second load pin, wherein the second load pin is coupled to a second load. The selection switch outputs either the first output voltage or the second output voltage to a voltage pin according to a selection signal.

According to an embodiment of the integrated circuit, the selection switch is a multiplexer.

According to an embodiment of the integrated circuit, each of the first load and the second load is a resistor or an electronic load.

According to an embodiment of the integrated circuit, the selection switch further serially outputs the first output voltage and the second voltage to the voltage pin.

In an embodiment, an integrated-circuit testing device comprises an integrated circuit, an integrated-circuit socket, a voltmeter, and a processor. The integrated circuit comprises a first power unit, a second power unit, and a selection switch. The first power unit generates a first output voltage and is coupled to a first load pin. The second power unit generates a second output voltage and is coupled to a second load pin. The selection switch outputs either the first output voltage or the second output voltage to the voltage pin according to a selection signal. The integrated-circuit socket comprises an integrated-circuit slot, a first load probe, and a second load probe. The integrated circuit is detachably placed in the integrated-circuit slot. The first load probe is coupled to the first load pin and coupled to a first load. The second load probe is coupled to the second load pin and coupled to a second load. The voltmeter is coupled to the voltage probe and measures, according to a measurement signal, a voltage of the voltage probe to generate a voltage signal. The processor generates the selection signal and the measurement signal and receives the voltage signal.

According to an embodiment of the integrated-circuit testing device, the selection switch is a multiplexer.

According to an embodiment of the integrated-circuit testing device, each of the first load and the second load is a resistor or an electronic load.

According to an embodiment of the integrated-circuit testing device, the processor further generates, according to a testing logic, the selection signal and the measurement signal to serially output the first output voltage and the second output voltage to the voltage pin, to serially measure the first voltage and the second voltage, and to store the first output voltage and the second voltage in a register.

In an embodiment, an integrated-circuit testing method, adapted in the integrated-circuit testing device stated above, comprises: respectively drawing a first load current and a second load current from the first power unit and the second power unit by the first load and the second load; outputting either the first output voltage or the second output voltage to the voltage pin according to the selection signal; and measuring the first output voltage and the second output voltage according to the measurement signal.

In an embodiment, the integrated-circuit testing method further comprises: serially outputting the first output voltage and the second output voltage by the selection signal; serially measuring the first output voltage and the second output voltage by the measurement signal; and storing the first output voltage and the second output voltage in a register.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
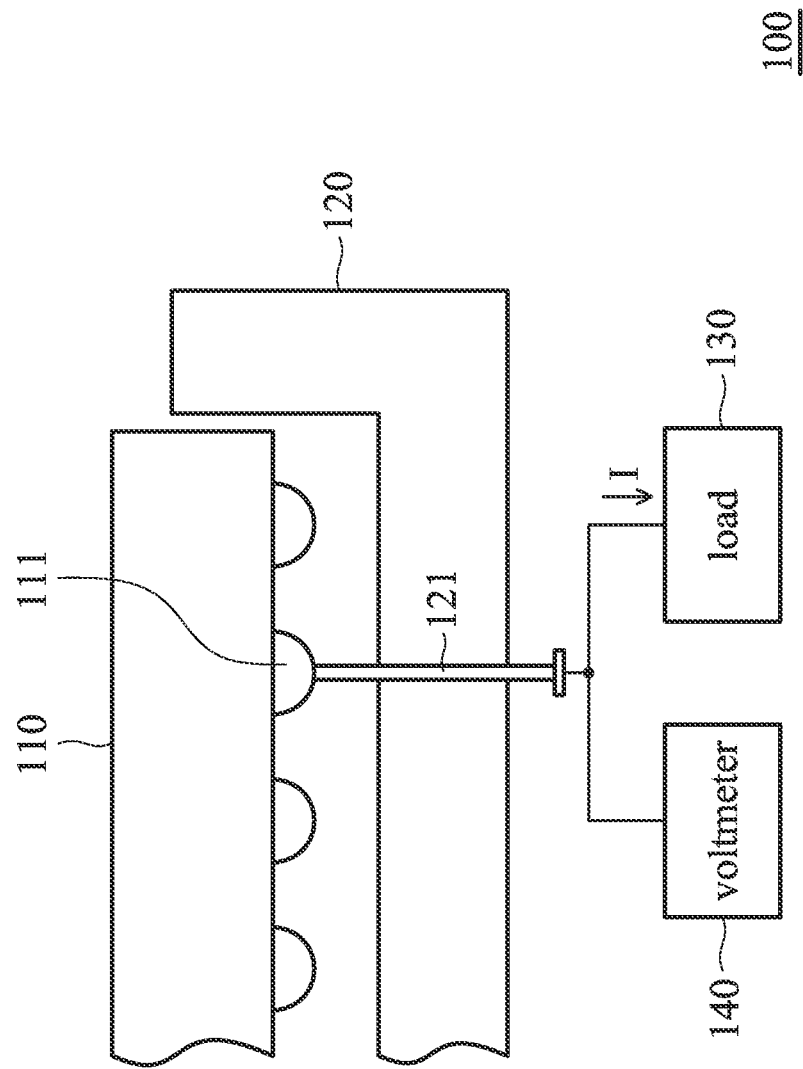
FIG. 1 is a schematic diagram of an integrated-circuit testing device in accordance with an embodiment of the invention.

FIG. 1 is a schematic diagram of an integrated-circuit testing device in accordance with an embodiment of the invention. As shown in FIG. 1, the integrated-circuit testing device 100 includes the integrated circuit 110, the integrated-circuit socket 120, the load 130, and the voltmeter 140. The integrated circuit 110 is detachably placed in the integrated-circuit socket 120, and the pin 111 of the integrated circuit 110 is coupled to the probe 121 of the integrated-circuit socket 120. When the load 130 draws the load current I, the voltmeter 140 measures the output voltage generated by the integrated circuit 110 through the probe 121.

However, since a voltage drop is caused by the load current I flowing through the probe 121, it makes the voltage measured by the voltmeter 140 the voltage drop lower than the actual output voltage generated by the integrated circuit 110. The larger the load current I is, the larger the generated voltage drop is, and also the more significant the measurement error that is caused.

Figure 2:
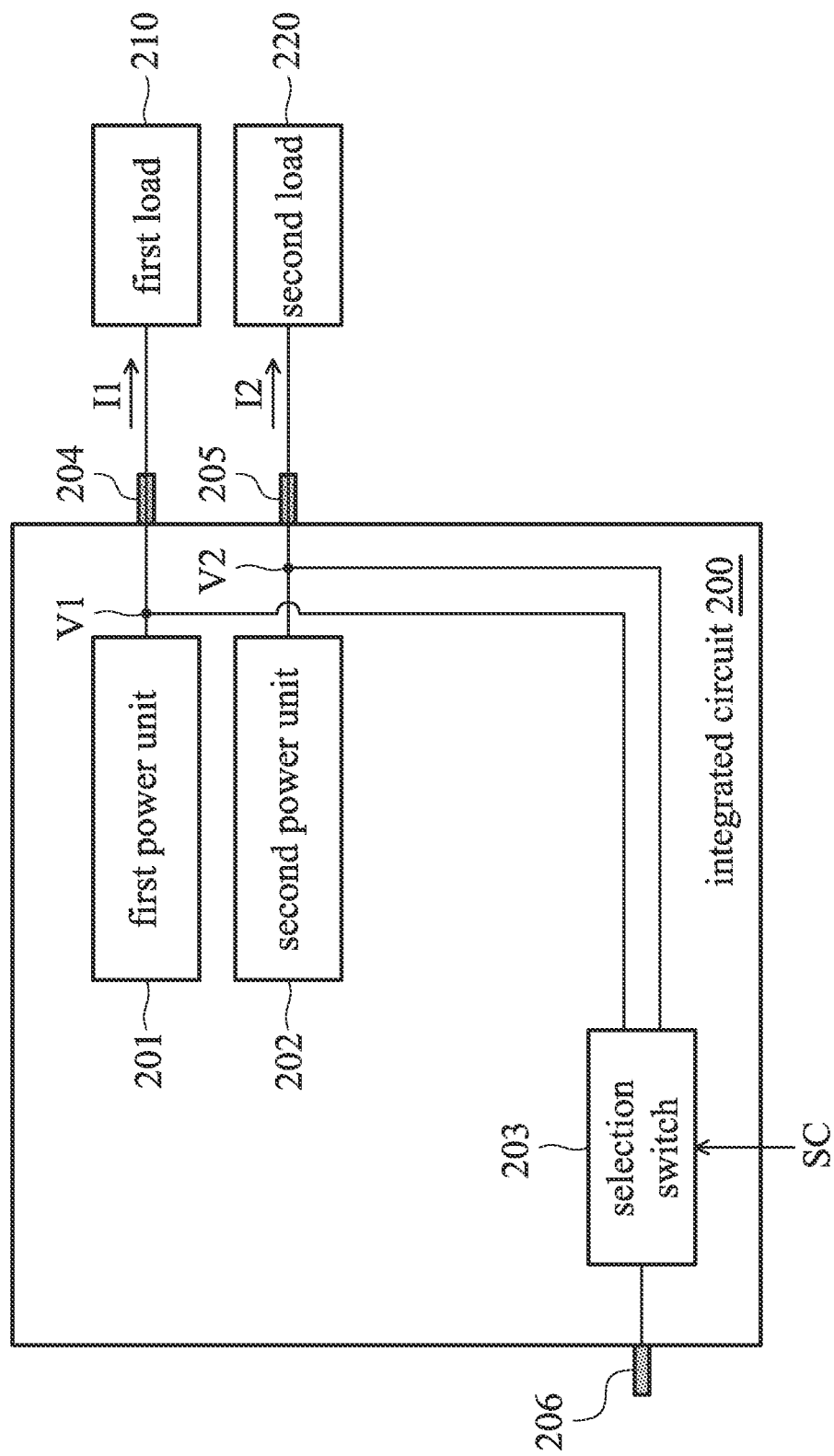
FIG. 2 is a block diagram of an integrated circuit in accordance with an embodiment of the invention.

FIG. 2 is a block diagram of an integrated circuit in accordance with an embodiment of the invention. As shown in FIG. 2, the integrated circuit 200 includes the first power unit 201, the second power unit 202, and the selection switch 203, and is supplied by a supply voltage (not shown in FIG. 2). The first power unit 201 generates the first output voltage V1 and is coupled to the first load pin 204. The second power unit 202 generates the second output voltage V2 and is coupled to the second load pin 205. According to another embodiment of the invention, the integrated circuit 200 includes a plurality of power units, and the first power unit 201 and the second power unit 202 are illustrated herein.

The selection switch 203 outputs either the first output voltage V1 or the second output voltage V2 to the voltage pin 206 according to the selection signal SC. According to an embodiment of the invention, the integrated circuit 200 is a packaged integrated circuit, and the first load pin 204, the second load pin 205, and the voltage pin 206 are the output pins of the integrated circuit 200.

The first load 210, which is coupled to the first load pin 204, is configured to draw the first load current I1 from the first power unit 201. The second load 220, which is coupled to the second load pin 205, is configured to draw the second load current I2 from the second power unit 202.

According to an embodiment of the invention, each the first load 210 and the second load 220 is a resistor with a resistance, and the first load current I1 and the second load current I2 are respectively determined by the first output voltage V1 and the second output voltage V2 divided by the corresponding resistance.

According to another embodiment of the invention, each of the first load 210 and the second load 220 is an electronic load, and the electronic load could be manually set the first load current I1 and the second load current I2. According to yet another embodiment of the invention, the first load 210 and the second load 220 could be resistors, electronic loads, and any combination of resistors and electronic loads.

According to an embodiment of the invention, the selection switch 203 is a multiplexer. According to another embodiment of the invention, the selection switch 203 can be any type of switch. According to an embodiment of the invention, the selection signal SC is generated by the Inter-Integrated Circuit (I2C) to control the selection switch 203 to select either the first output voltage V1 or the second output voltage V2. According to another embodiment of the invention, the selection signal SC can be generated by any kind of signal generation method which is recently known or is invented in the future.

According to an embodiment of the invention, the selection switch 203 serially outputs the first output voltage V1 and the second output voltage V2 to the voltage pin 206 according to a testing logic. According to another embodiment of the invention, the selection switch 203 outputs the first output voltage V1 and the second output voltage V2 to the voltage pin 206 in the sequence set by the users, according to a testing logic. According to yet another embodiment of the invention, the integrated circuit 200 includes a plurality of power units, and the selection switch 203 serially outputs the output voltage generated by the plurality of power units according to a testing logic.

Figure 3:
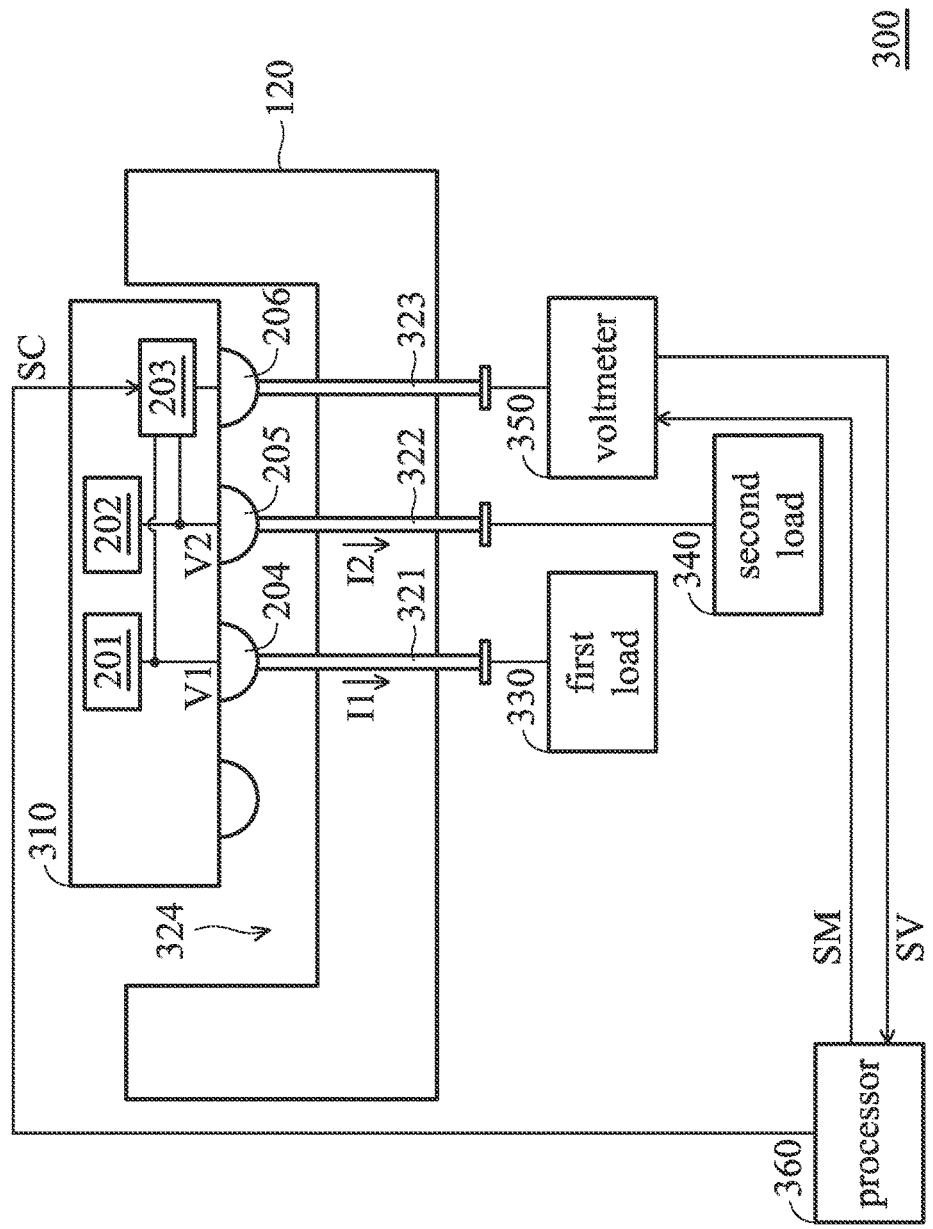
FIG. 3 is a schematic diagram of an integrated-circuit testing device in accordance with an embodiment of the invention.

FIG. 3 is a schematic diagram of an integrated-circuit testing device in accordance with an embodiment of the invention. As shown in FIG. 3, the integrated-circuit testing device 300 includes integrated circuit 310, the integrated-circuit socket 320, the first load 330, the second load 340, the voltmeter 350, and the processor 360. The integrated circuit 310 in FIG. 3 is identical to the integrated circuit 200 in FIG. 2. The integrated circuit 310 includes the first power unit 201, the second power unit 202, the selection switch 203, the first load pin 204, the second load pin 205, and the voltage pin 206.

The integrated-circuit socket 320 includes the first load probe 321, the second load probe 322, the voltage probe 323, and the integrated-circuit slot 324. The integrated circuit 310 is detachably placed in the integrated-circuit slot 324. The first load pin 204 is coupled to the first load 330 through the first load probe 321, and the second load pin 205 is coupled to the second load 340 through the second load probe 322. The voltage pin 206 is coupled to the voltmeter 350 through the voltage probe 323.

Since the first power unit 201 and the second power unit 202 are respectively coupled to the first load 330 and the second load 340 through the first load probe 321 and the second load probe 322, the first load 330 draws the first load I1 from the first power unit, and the second load 340 draws the second load current I2 from the second power unit 202.

The processor 360 outputs either the first output voltage V1 or the second output voltage V2 to the voltage pin 313 of the integrated circuit 310. The processor 360 further controls, by the measurement signal SM, the voltmeter 350 to measure the voltage of the voltage probe 323, and the voltmeter 350 then outputs the voltage signal SV to the processor 360. The processor determines the voltage values of the first output voltage V1 and the second output voltage V2 according to the voltage signal SV and the generated selection signal SC.

According to an embodiment of the invention, the processor 360, according to a testing logic, generates the selection signal SC and the measurement signal SM to serially output the first output voltage V1 and the second output voltage V2 to the voltage pin 206, and to serially measure the first output voltage V1 and the second output voltage V2 which are output to the voltage probe 323. The measured first output voltage V1 and the measured second output voltage V2 are stored in a register (not shown in FIG. 3). According to another embodiment of the invention, the selection switch 203 serially outputs the first output voltage V1 and the second output voltage V2 in the sequence set by users to the voltage pin 206 according to a testing logic.

According to another embodiment of the invention, the integrated circuit 310 includes a plurality of power units. The selection switch 203, according to a testing logic, serially outputs a plurality of output voltages of the plurality of power units to the voltage pin 206, and serially measures the output voltages output to the voltage probe 323. The measured plurality of output voltages are stored in a register (not shown in FIG. 3).

According to another embodiment of the invention, each of the first load 330 and the second load 340 is an electronic load. The electronic load can be manually set the first load current I1 and the second load current I2. According to yet another embodiment of the invention, the first load 330 and the second load 340 can be resistors, electronic loads, and any combination of resistors and electronic loads.

Figure 4:
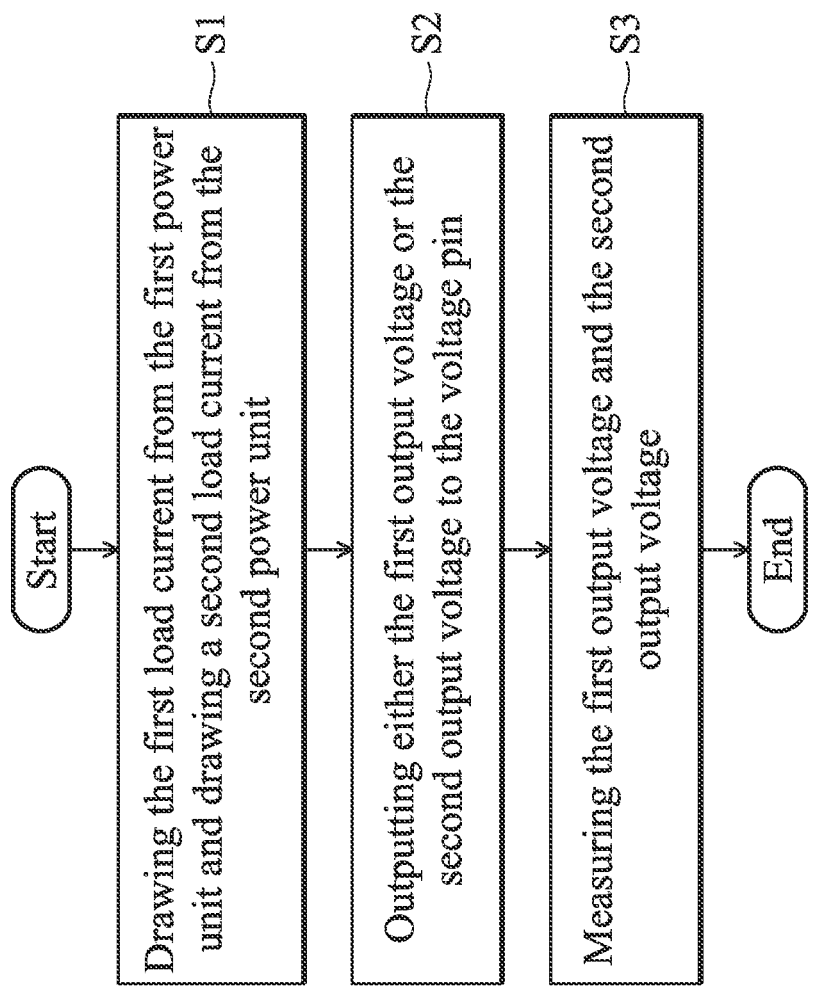
FIG. 4 is a flow chart of an integrated-circuit testing method in accordance with an embodiment of the invention.

FIG. 4 is a flow chart of an integrated-circuit testing method in accordance with an embodiment of the invention. The following description of FIG. 4 is accompanied with FIG. 3 for the detailed explanation. As shown in FIG. 4, the first load 330 is firstly configured to draw the first load current I1 from the first power unit 201, and the second load 340 is configured to draw a second load current I2 from the second power unit 202 (Step S1).

Then, either the first output voltage V1 or the second output voltage V2 is output to the voltage pin 206 according to the selection pin 206 (Step S2). Finally, the first output voltage V1 and the second output voltage V2 are measured according to the measurement signal SM (Step S3).

According to an embodiment of the invention, the first output voltage V1 and the second output voltage V2 are serially output according to the selection signal SC in Step S2. The first output voltage V1 and the second output voltage V2 are serially measured according to the measurement signal SM in Step S3, and the measured first output voltage V1 and the measured second voltage V2 are stored in a register.

The first power unit 201 in FIG. 3 is taken as an example. When the first output voltage V1 is selected to be output to the voltage pin 206 by the selection signal SC, the first load 330 draws a first load current I1 from the first power unit 201. If the voltmeter 350 measures the first output voltage V1 at the first load probe 321, a voltage drop caused by the first load current I1 and the resistance of the first load probe 321 makes the measured first voltage V1 incorrect, and it is even worse when the first load current I1 is larger.

However, the invention provides a method to output the first output voltage V1 to the voltage pin 206 by the selection switch 203 and to measure the first output voltage V1 by the voltmeter 350 through the voltage probe 323. Therefore, the first output voltage V1 measured by the voltmeter 350 is not influenced by the voltage drop caused by the first load current I1 and the resistance of the first load probe 321 which leads to the measured first voltage V1 lower than that really generated by the first power unit 201.

Furthermore, since the integrated-circuit socket 320 is merely configured for the testing purpose, the tested integrated circuit 310 is welded in a printed circuit board in the real application. Therefore, the voltage drops caused by the first load probe 321 and the second load probe 322 do not exist in the real application. In addition, the incorrect measurement caused by the voltage drop due to the first load probe 321 and the second load probe 322 can be avoided by the integrated-circuit testing device 300 of the invention.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An integrated circuit, comprising:
    a first power circuit, configured to generate a first output voltage coupled to a first load pin, the first load pin being further coupled to a first load that is external to the integrated circuit;
    a second power circuit, configured to generate a second output voltage coupled to a second load pin, the second load pin being further coupled to a second load that is external to the integrated circuit;
    a selection switch, configured to output either the first output voltage or the second output voltage to a voltage pin according to a selection signal; and
    a voltmeter coupled to the selection switch via the voltage pin, the voltmeter being configured to measure the first output voltage and the second output voltage output by the selection switch and to generate a voltage signal indicative of the measured first output voltage and the measured second output voltage.

2. The integrated circuit of claim 1, wherein the selection switch is a multiplexer.

3. The integrated circuit of claim 1, wherein each of the first load and the second load is a resistor or an electronic load.

4. The integrated circuit of claim 1, wherein the selection switch is further configured to serially output the first output voltage and the second voltage to the voltage pin.

5. An integrated-circuit testing device, comprising:
    an integrated circuit, comprising:
        a first power circuit, configured to generate a first output voltage, the first power circuit being coupled to a first load pin;
        a second power circuit, configured to generate a second output voltage, the second power circuit being coupled to a second load pin; and
        a selection switch, configured to output either the first output voltage or the second output voltage to a voltage pin according to a selection signal;
    an integrated-circuit socket, comprising:
        an integrated-circuit slot, configured to receive the integrated circuit, wherein the integrated circuit is detachable when placed in the integrated-circuit slot;
        a first load probe, coupled to the first load pin, the first load pin configured to be coupled to a first load external to the integrated circuit; and
        a second load probe, coupled to the second load pin, the second load pin configured to be coupled to a second load external to the integrated circuit;
    a voltmeter, coupled to the voltage pin via a voltage probe, the voltmeter being configured to measure, according to a measurement signal, a voltage at the voltage probe and to generate a voltage signal; and
    a processor configured to generate the selection signal and the measurement signal, and to receive the voltage signal.

6. The integrated-circuit testing device of claim 5, wherein the selection switch is a multiplexer.

7. The integrated-circuit testing device of claim 5, wherein each of the first load and the second load is a resistor or an electronic load.

8. The integrated-circuit testing device of claim 5, wherein the processor is further configured to:
    generate, according to a testing logic, the selection signal and the measurement signal,
    serially output the first output voltage and the second output voltage to the voltage pin,
    serially measure the first voltage and the second voltage, and
    store the first output voltage and the second voltage in a register.

9. An integrated-circuit testing method in an integrated-circuit testing device having an integrated circuit, an integrated-circuit socket, a voltmeter, and a processor, the integrated circuit having (i) a first power circuit configured to generate a first output voltage, the first power circuit being coupled to a first load pin, (ii) a second power circuit configured to generate a second output voltage, the second power circuit being coupled to a second load pin, and (iii) a selection switch configured to output either the first output voltage or the second output voltage to a voltage pin according to a selection signal, the integrated-circuit socket having (i) an integrated-circuit slot configured to receive the integrated circuit, the integrated circuit being detachable when placed in the integrated-circuit slot, (ii) a first load probe coupled to the first load pin, the first load pin configured to be coupled to a first load that is external to the integrated circuit, and (iii) a second load probe coupled to the second load pin, the second load pin configured to be coupled to a second load that is external to the integrated circuit, the voltmeter being coupled to the voltage pin via a voltage probe and configured to measure, according to a measurement signal, a voltage at the voltage probe and to generate a voltage signal, the method comprising:

respectively drawing a first load current and a second load current from the first power circuit and the second power circuit by the first load and the second load;

outputting, by the processor, either the first output voltage or the second output voltage to the voltage pin according to the selection signal; and measuring, by the processor, the first output voltage and the second output voltage according to the measurement signal.

10. The integrated-circuit testing method of claim 9, further comprising:

serially outputting, by the processor, the first output voltage and the second output voltage according to the selection signal;

serially measuring, by the processor, the first output voltage and the second output voltage according to the measurement signal; and storing, by the processor, the first output voltage and the second output voltage in a register.

11. The integrated circuit of claim 1, wherein:

the first load and the second load is each associated with a first resistance and a second resistance, respectively, the processor is further configured to measure a first load current drawn by the first power circuit via the first load pin by dividing the first output voltage by the first resistance, and to measure a second load current drawn by the second power circuit via the second load pin by dividing the second output voltage by the second resistance.

12. The integrated circuit of claim 1, wherein the processor is further configured to generate a measurement signal, and wherein the voltmeter is further coupled to the processor, the voltmeter being configured to measure the first output voltage and the second output voltage output by the selection switch in response to receiving the measurement signal.

13. The integrated circuit of claim 12, wherein the voltmeter is coupled to the selection switch via a voltage probe that is coupled to the voltage pin, and wherein the selection switch is configured to prevent a voltage drop of the first output voltage and the second output voltage through the voltage probe and the voltage pin as the first power circuit and the second power circuit generates the first and the second output voltages, respectively.

14. The integrated circuit of claim 13, wherein the first power circuit and the second power circuit generate the first and the second output voltage, respectively, as a result of current drawn by the first load via the first load pin and the second load via the second load pin, respectively.

15. The integrated circuit of claim 1, wherein the selection switch is coupled directly to an output of the first power circuit and the second power circuit, respectively, within the integrated circuit such that the first output voltage and the second output voltage measured by the voltmeter are internal integrated circuit voltage measurements.

* * * * *